United States Patent
Yoshida et al.

(10) Patent No.: US 9,553,230 B2
(45) Date of Patent: Jan. 24, 2017

(54) METHOD AND APPARATUS FOR FABRICATING LIGHT EMITTING APPARATUS

(71) Applicant: PANASONIC INTELLECTUAL PROPERTY MANAGEMENT CO., LTD., Osaka (JP)

(72) Inventors: Norio Yoshida, Nara (JP); Hirotaka Uemi, Hyogo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/764,331

(22) PCT Filed: Jan. 29, 2014

(86) PCT No.: PCT/JP2014/000442
§ 371 (c)(1),
(2) Date: Jul. 29, 2015

(87) PCT Pub. No.: WO2014/119295
PCT Pub. Date: Aug. 7, 2014

(65) Prior Publication Data
US 2015/0364644 A1 Dec. 17, 2015

(30) Foreign Application Priority Data

Jan. 31, 2013 (JP) ................................. 2013-017812
Nov. 12, 2013 (JP) ................................. 2013-234479

(51) Int. Cl.
*H01L 33/00* (2010.01)
*H01L 21/66* (2006.01)
(Continued)

(52) U.S. Cl.
CPC .......... *H01L 33/0095* (2013.01); *C09K 11/02* (2013.01); *C09K 11/08* (2013.01); *H01L 22/10* (2013.01);
(Continued)

(58) Field of Classification Search
CPC ............................. H01L 33/0095; H01L 22/10
(Continued)

(56) References Cited

U.S. PATENT DOCUMENTS 7,419,839 B2  9/2008  Camras et al.
7,462,502 B2  12/2008  Paolini et al.
(Continued)

FOREIGN PATENT DOCUMENTS

JP    2002-344029    11/2002
JP    2005-079540    3/2005
(Continued)

OTHER PUBLICATIONS

Search Report and Written Opinion in PCT/JP2014/000442, dated Apr. 1, 2014.
(Continued)

*Primary Examiner* — Moazzam Hossain
(74) *Attorney, Agent, or Firm* — Greenblum & Bernstein, P.L.C.

(57) ABSTRACT

A method for fabricating a light emitting apparatus in which at least a portion of a light emitting element is covered with a light transmissive resin containing phosphor which emits light when excited by light emitted by the light emitting element, the method including directly processing the phosphor by irradiating the phosphor with a laser beam which passes through the light transmissive resin, to adjust the chromaticity of light to be emitted by the light emitting apparatus.

7 Claims, 9 Drawing Sheets

(51) Int. Cl.
*H01L 33/08* (2010.01)
*H01L 33/24* (2010.01)
*H01L 33/50* (2010.01)
*C09K 11/02* (2006.01)
*C09K 11/08* (2006.01)
*H01L 25/075* (2006.01)
*H01L 33/48* (2010.01)

(52) U.S. Cl.
CPC ......... *H01L 33/502* (2013.01); *H01L 25/0753* (2013.01); *H01L 33/486* (2013.01); *H01L 33/504* (2013.01); *H01L 2224/48091* (2013.01); *H01L 2224/48247* (2013.01); *H01L 2933/0041* (2013.01)

(58) Field of Classification Search
USPC .......................................................... 438/16
See application file for complete search history.

(56) References Cited

U.S. PATENT DOCUMENTS

| | | |
|---|---|---|
| 7,902,566 B2 | 3/2011 | Paolini et al. |
| 8,067,254 B2 | 11/2011 | Camras et al. |
| 8,202,742 B2 | 6/2012 | Paolini et al. |
| 8,486,725 B2 | 7/2013 | Paolini et al. |
| 8,748,912 B2 | 6/2014 | Camras et al. |
| 8,791,630 B2 * | 7/2014 | Maemura ................ H01J 29/20 313/483 |
| 8,846,423 B2 | 9/2014 | Camras et al. |
| 2002/0171911 A1 * | 11/2002 | Maegawa ............... H01L 33/50 359/308 |
| 2005/0274967 A1 * | 12/2005 | Martin ..................... C03C 3/12 257/98 |
| 2006/0105478 A1 | 5/2006 | Camras et al. |
| 2006/0105482 A1 | 5/2006 | Alferink et al. |
| 2006/0208260 A1 * | 9/2006 | Sakuma ................ C04B 35/597 257/76 |
| 2006/0258028 A1 | 11/2006 | Paolini et al. |
| 2008/0006524 A1 * | 1/2008 | Liu ........................... B22F 9/12 204/192.12 |
| 2008/0137106 A1 * | 6/2008 | Ono ..................... G01B 11/0625 356/630 |
| 2008/0186702 A1 | 8/2008 | Camras et al. |
| 2009/0072263 A1 | 3/2009 | Paolini et al. |
| 2009/0296384 A1 * | 12/2009 | Van De Ven ...... H05B 33/0803 362/231 |
| 2010/0109568 A1 | 5/2010 | Camras et al. |
| 2010/0127289 A1 * | 5/2010 | Helbing ................ H01L 33/508 257/98 |
| 2010/0193021 A1 * | 8/2010 | Park ................ H01L 31/022466 136/256 |
| 2011/0132521 A1 * | 6/2011 | Paolini ..................... H01L 33/50 156/67 |
| 2011/0193025 A1 * | 8/2011 | Ichikawa ............. C09K 11/025 252/301.4 R |
| 2011/0279018 A1 * | 11/2011 | Emoto ................ C01B 21/0821 313/503 |
| 2012/0043564 A1 | 2/2012 | Camras et al. |
| 2012/0051377 A1 * | 3/2012 | Liang .................... H01S 5/0092 372/36 |
| 2012/0238041 A1 | 9/2012 | Paolini et al. |
| 2013/0092965 A1 | 4/2013 | Kijima et al. |
| 2013/0293145 A1 | 11/2013 | Camras et al. |
| 2014/0168942 A1 * | 6/2014 | Kishimoto ............ F21S 48/214 362/84 |
| 2015/0137165 A1 | 5/2015 | Tagami et al. |

FOREIGN PATENT DOCUMENTS

| | | | | |
|---|---|---|---|---|
| JP | 2008-019407 A * | 5/2006 | ............. | H01L 33/00 |
| JP | 2007-324608 | 12/2007 | | |
| JP | 2008-019407 | 1/2008 | | |
| JP | 2011165827 A * | 8/2010 | ............. | H01L 33/50 |
| JP | 2010-219166 | 9/2010 | | |
| JP | 2011-165827 | 8/2011 | | |
| JP | 2011-249316 | 12/2011 | | |
| JP | 2012-016727 | 1/2012 | | |
| JP | 2013-030594 | 2/2013 | | |

OTHER PUBLICATIONS

Extended European Search Report in EP 14745840.0, dated Jan. 22, 2016.
Search Report and Written Opinion in PCT/JP2014/00042, dated Apr. 1, 2014.

* cited by examiner

METHOD AND APPARATUS FOR FABRICATING LIGHT EMITTING APPARATUS

TECHNICAL FIELD

The present invention relates to a method and an apparatus for fabricating a light emitting apparatus and, more particularly, to a method and an apparatus for fabricating a light emitting apparatus which adjusts the chromaticity of the light emitting apparatus.

BACKGROUND ART

As a light emitting apparatus (a light emitting device) which emits white light, a light emitting apparatus which includes blue LED chips sealed with a light transmissive resin containing phosphor is known.

In such a light emitting apparatus, a portion of blue light emitted by the blue LED chip excites the phosphor, which causes the phosphor to emit yellow phosphor light. Then, the blue light emitted by the blue LED chip and the yellow phosphor light emitted by the excited phosphor are mixed and white light is obtained. The chromaticity of the white light provided by the light emitting apparatus depends on a ratio between an amount of blue light emitted by the blue LED chip and an amount of yellow phosphor light emitted by the phosphor.

Such a light emitting apparatus causes variations in performance of the blue LED chips, and variation in chromaticity of the white light depending on an amount of the phosphor.

To solve such problems, Patent Literature (PTL) 1 discloses a technique of removing a phosphor layer comprising phosphor by irradiating the phosphor layer with a laser beam, for adjusting the chromaticity of an emission color of the light emitting apparatus.

CITATION LIST

Patent Literature

[PTL 1] Japanese Unexamined Patent Application Publication No. 2002-344029
[PTL 2] Japanese Unexamined Patent Application Publication No. 2011-165827

SUMMARY OF INVENTION

Technical Problem

However, when the chromaticity of a light emitting apparatus is adjusted in a manner disclosed in PTL 1, the light transmissive resin is alternated and carbonized, ending up blocking the light emitted from the blue LED chip. Consequently, the efficiency of emission of light may decrease.

Thus, the present invention provides a method and an apparatus for fabricating a light emitting apparatus which can adjust the chromaticity, while reducing carbonization and alternation of a light transmissive resin.

Solution to Problem

A method for fabricating a light emitting apparatus according to an aspect of the present invention is a method for fabricating a light emitting apparatus in which at least a portion of a light emitting element is covered with a light transmissive resin containing phosphor particles which emit light when excited by light emitted by the light emitting element, the method including: (a) directly processing the phosphor particles by irradiating the phosphor particles with a laser beam which passes through the light transmissive resin, to adjust chromaticity of light to be emitted by the light emitting apparatus.

Moreover, in step (a), the phosphor particles may be crushed into small particles by being irradiated with the laser beam.

Moreover, in step (a), the phosphor particles may each form a flat surface by being irradiated with the laser beam.

Moreover, in step (a), the phosphor particles may be crushed and scattered by being irradiated with the laser beam.

Moreover, in step (a), a phosphor particle that has a predetermined particle size or greater, among the phosphor particles, may be crushed into small particles by being irradiated with the laser beam, to reduce variations in particle size.

Moreover, in step (a), the phosphor particles may be crushed into small particles by being irradiated with the laser beam, into a predetermined particle size distribution.

Moreover, in step (a), a specific phosphor particle, among the phosphor particles, may be directly processed by being irradiated with the laser beam.

Moreover, in step (a), the phosphor particles may be directly processed by being irradiated with the laser beam to adjust the chromaticity of light to be emitted by the light emitting apparatus to a predetermined value, while measuring chromaticity of the light emitted by the light emitting apparatus.

Moreover, the method may further include (b) measuring chromaticity of the light emitted by the light emitting apparatus.

An apparatus for fabricating a light emitting apparatus according to an aspect of the present invention is an apparatus for fabricating a light emitting apparatus in which at least a portion of a light emitting element is covered with a light transmissive resin containing phosphor particles which emit light when excited by light emitted by the light emitting element, the apparatus including an irradiating unit configured to directly process the phosphor particles by irradiating the phosphor particles with a laser beam which passes through the light transmissive resin, to adjust chromaticity of light to be emitted by the light emitting apparatus.

Moreover, the apparatus may further include: an adjusting unit configured to adjust relative positional relationship between the light emitting apparatus and an irradiation position of the laser beam which is emitted by the irradiating unit; and a control unit configured to control a light emitting state of the laser beam which is emitted by the irradiating unit.

Moreover, the irradiating unit may include a laser oscillator which emits a laser beam and an optical system which collects and sends to the phosphor particles the laser beam emitted by the laser oscillator, and the adjusting unit is configured to adjust positional relationship between the laser oscillator, the optical system, and the light emitting apparatus to adjust the relative positional relationship between the light emitting apparatus and the irradiation position of the laser beam which is emitted by the irradiating unit.

Moreover, the laser oscillator may be a short pulse laser.

Moreover, the adjusting unit may include a first mechanism for changing the relative positional relationship between the light emitting apparatus and the irradiation position of the laser beam which is emitted by the irradiating unit, in an optical axis direction of the laser beam and a direction perpendicular to the optical axis direction.

Moreover, the adjusting unit may further include a second mechanism for changing an optical axis tilt of the laser beam relative to the light emitting apparatus.

Moreover, the adjusting unit may adjust the positional relationship to cause the laser beam to focus onto one of the phosphor particles.

Moreover, the irradiating unit may irradiate the phosphor particles with the laser beam so that the phosphor particles each form a flat surface.

Moreover, the apparatus may further include a measuring unit configured to measure at least locations of the phosphor particles, wherein the irradiating unit is configured to directly process a phosphor particle within a specific area among the phosphor particles by irradiating the phosphor particle within the specific area with the laser beam.

Moreover, the measuring unit may further measure particle sizes of the phosphor particles, and the irradiating unit may irradiate a phosphor particle having a predetermined particle size or greater, among the phosphor particles, with the laser beam to crush the phosphor particle having the predetermined particle size or greater into small particles.

Moreover, the measuring unit may further measure particle sizes of the phosphor particles, and the irradiating unit is configured to irradiate the phosphor particles with the laser beam to crush the phosphor particles into small particles into a predetermined particle size distribution.

Moreover, the light transmissive resin may contain the phosphor particles including several types of phosphor particles having different emission spectra, the measuring unit may further measure the several types of phosphor particles, and the irradiating unit may directly process a phosphor particle of a specific type, among the several types of the phosphor particles, by irradiating the phosphor particle of the specific type with the laser beam.

Advantageous Effects of Invention

According to the method and the apparatus for fabricating the light emitting apparatus of the present invention, the chromaticity of the light emitting apparatus is adjusted, while reducing carbonization and alternation of the light transmissive resin.

Figure 1:
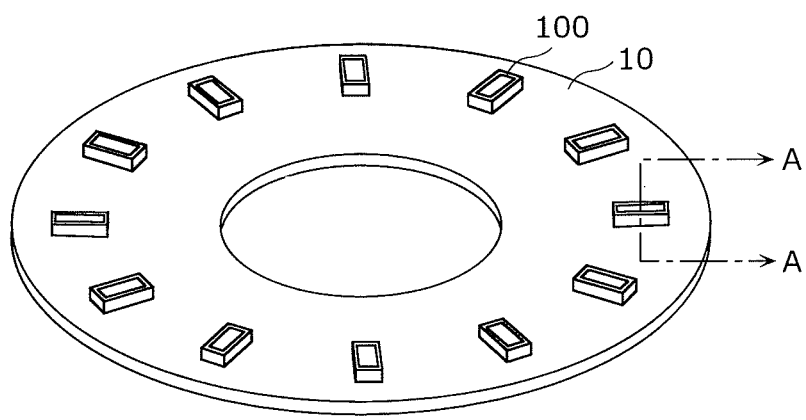
FIG. 1 is a diagram showing a substrate having light emitting apparatuses according to an embodiment 1 mounted thereon.

DESCRIPTION OF EMBODIMENTS (Underlying Knowledge Forming Basis of the Present Invention)

As described in Background Art, the technique of adjusting the chromaticity of light to be emitted by a light emitting apparatus is known.

PTL 1 discloses a technique of removing a phosphor layer comprising phosphor by irradiating the phosphor layer with a laser beam, for adjusting chromaticity of the emission color of a light emitting apparatus.

However, when the chromaticity of the light emitting apparatus is adjusted in a manner described in PTL 1, a light transmissive resin is altered or carbonized, ending up blocking the light emitted by a blue LED chip. Consequently, the efficiency of emission of light may reduce.

For example, PTL 2 discloses a technique of measuring the chromaticity of the light emitted by a light emitting apparatus when inspecting lighting of the light emitting apparatus, and irradiating the light emitting apparatus with the laser beam at a laser irradiation dose corresponding to a deviation of the chromaticity of the light emitted from desired chromaticity, for adjusting the chromaticity of the emission color of the light emitting apparatus.

Here, the laser irradiation dose is controlled by adjusting the number of times the light emitting apparatus is irradiated with the laser beam, and the output energy. However, in a manner where the laser irradiation dose is changed depending on a measurement of the chromaticity as disclosed in PTL 2, it is difficult to accurately adjust the chromaticity of light to be emitted by the light emitting apparatus to desired chromaticity.

Additionally, while the laser beam the light emitting apparatus is irradiated with passes through a light transmissive resin and is absorbed by phosphor, a portion of the emitted laser beam may not hit the phosphor. For this reason, the portion of the laser beam does not contribute to adjusting the chromaticity. This is therefore inefficient.

The present invention is made by the inventors based on the findings as described above. The present invention provides a method and an apparatus for fabricating a light emitting apparatus which adjusts the chromaticity more accurately and efficiently than conventional, while reducing carbonization and alternation of the light transmissive resin.

Hereinafter, a method and an apparatus for fabricating a light emitting apparatus according to embodiments of the present invention will be described, with reference to the accompanying drawings. The embodiments described below are each merely a preferred illustration of the present invention. Values, shapes, materials, components, and arrangement and connection between the components shown in the following embodiments are merely illustrative and are not intended to limit the present invention. Therefore, among the components of the embodiments below, components not recited in any one of the independent claims are described as arbitrary components.

The figures are schematic illustration and do not necessarily limit the present invention to that precisely shown. In the figures, the same reference sign is used to refer to substantially the same component, and description already set forth is may be omitted or simplified.

(Embodiment 1)

Figure 2:
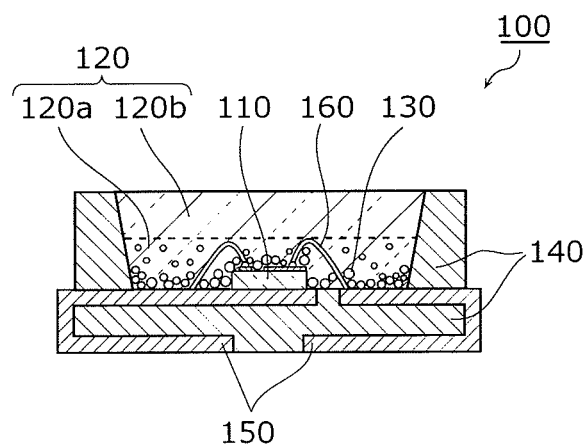
FIG. 2 is a cross-sectional view of one of the light emitting apparatuses shown in FIG. 1, taken along A-A.

First, a light emitting apparatus according to an embodiment 1 is described. FIG. 1 is a diagram showing a substrate having light emitting apparatuses according to the embodiment 1 mounted thereon. FIG. 2 is a cross-sectional view of one of the light emitting apparatuses shown in FIG. 1, taken along A-A.

As shown in FIG. 1, for example, a light emitting apparatus 100 is mounted on a substrate 10 and used as an illumination source or a lighting apparatus. In FIG. 1, the substrate 10 has a plan shape of a circular having an opening in the center. A plurality of light emitting apparatuses 100 are disposed side by side circumferentially on the substrate 10. The substrate 10 having the light emitting apparatuses 100 disposed thereon is used, specifically, for a bulb-shaped LED lamp (an illumination source).

The light emitting apparatus 100 is what is known as an SMD (surface mount device) light emitting apparatus and emits white light. As shown in FIG. 2, the light emitting apparatus 100 includes an LED chip 110 (a light emitting element), a color converting portion 120 (a phosphor layer 120a and a resin layer 120b) comprising a light transmissive resin containing phosphor 130, a package 140, a lead frame 150, and a bonding wire 160.

The LED chip 110 is by way of example of a light emitting element. The LED chip 110 is a bare chip which emits monochromatic visible light and mounted onto the bottom surface of a recess of the package 140 by die bonding using a die attach material (a die bond material). The LED chip 110 may be, for example, a blue-emitting LED chip which emits blue light. Examples of the blue-emitting LED chip include a gallium nitride-based semiconductor light-emitting element comprising an InGaN-based material and having a center wavelength of 440 nm to 470 nm.

The color converting portion 120 is a light transmissive resin containing the phosphor 130 which is a light wavelength converting material. The color converting portion 120 wavelength-converts the light from the LED chip 110. The color converting portion 120 is sealing the LED chip 110 to protect the LED chip 110. The recess of the package 140 is filled with the light transmissive resin included in the color converting portion 120, up to the opening surface of the recess. Examples of the light transmissive resin included in the color converting portion 120 include, specifically, a dimethyl silicone resin, a phenyl silicone resin, a silsesquioxane resin, an epoxy resin, a fluorine resin, an acrylic resin, a polycarbonate resin, etc.

The color converting portion 120 includes the phosphor layer 120a and a resin layer 120b in the embodiment 1. The phosphor layer 120a is the light transmissive resin containing the phosphor 130, covering at least the light-exiting side (the upper portion) of the LED chip 110. The resin layer 120b comprises a light transmissive resin disposed above the phosphor layer 120a. The resin layer 120b is free of the phosphor 130. It should be noted that the resin layer 120b may not be provided.

It should be noted that the color converting portion 120 may be formed in a sheet or a plate shape, and disposed covering the opening of the recess of the package 140. In this case, the color converting portion 120 is fixed to the opening surface of the package 140 such that an air gap is created between the color converting portion 120 and the LED chip 110.

The phosphor 130 is a yellow phosphor particle which emits yellow phosphor light when excited by light emitted by the LED chip 110. If the LED chip 110 is a blue-emitting LED chip, the phosphor 130 is yttrium aluminum garnet (YAG) based yellow phosphor. It should be noted that the phosphor 130 may be orthosilicate-based phosphor or oxynitride phosphor. The phosphor particle 130 basically has a spherical shape and a plurality of phosphor particles 130 are included in the color converting portion 120.

The phosphor is generally excited by light having a shorter wavelength than the light the phosphor emits. Thus, the light (second light) emitted by the phosphor 130 has a longer wavelength than the light (first light) emitted by the light emitting element 110. Specifically, the phosphor 130 emits yellow phosphor light having a wavelength longer than 450 nm.

Since the phosphor 130 emits yellow phosphor light when excited by blue light emitted by the LED chip 110 in such a manner, the light emitting apparatus 100 (the color converting portion 120) emits white light by a combination of the excited yellow phosphor light and the blue light, which has spectral distribution in a relatively wide range of wavelength (e.g., about 400 nm to about 680 nm).

The package 140 is a container obtained by molding a non-light transmissive resin (a white resin or the like), and has an inverted frustoconical recess (a cavity). The inner surface of the recess is slanted and configured to upwardly reflect the light emitted from the LED chip 110. The package 140 is formed of a resin, specifically, a phenolic resin, an epoxy resin, a polyimide resin, a BT resin, polyphthalamide (PPA), or the like. It should be noted that the package 140 may be formed of a ceramic.

The lead frame 150 is a pair of a positive electrode and a negative electrode. The lead frame 150 comprises a metal member, such as iron, phosphor bronze, copper alloy, for example, and connects the LED chip 110 and an external electrode (not shown) disposed on the substrate 10. The lead frame 150 is connected to the LED chip 110 by the bonding wire 160.

Figure 3:
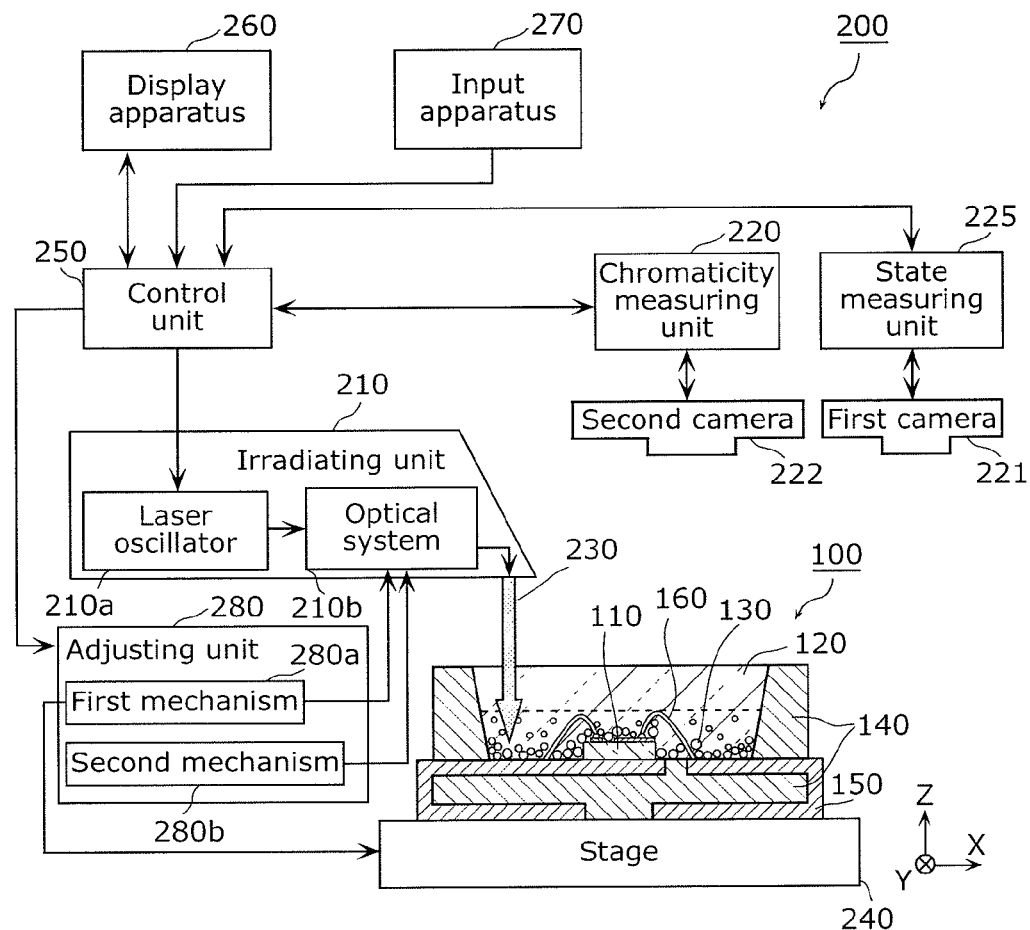
FIG. 3 is a diagram schematically illustrating an apparatus for fabricating the light emitting apparatus according to the embodiment 1.

Next, an apparatus for fabricating the light emitting apparatus 100 is described. FIG. 3 is a diagram schematically illustrating the apparatus for fabricating the light emitting apparatus 100.

As shown in FIG. 3, a fabricating apparatus 200 includes an irradiating unit 210, a chromaticity measuring unit 220, a state measuring unit 225 (a measuring unit), a stage 240, a control unit 250, a display apparatus 260, an input apparatus 270, an adjusting unit 280, a first camera 221, and a second camera 222. The irradiating unit 210 includes a laser oscillator 210a and an optical system 210b. The adjusting unit 280 includes a first mechanism 280a and a second mechanism 280b. It should be noted that the first camera 221 and the second camera 222 may be substituted by a camera that has functionality of the first camera 221 and the second camera 222.

The irradiating unit 210 directly processes the phosphor by irradiating the phosphor with a laser beam 230 which passes through the color converting portion 120, thereby adjusting the chromaticity of light to be emitted by the light emitting apparatus 100. The irradiating unit 210, specifically, irradiates the light emitting apparatus 100 with a laser beam emitted by the laser oscillator 210a via the optical system 210b, thereby directly processing the phosphor.

Examples of the irradiating unit 210 (the laser oscillator 210a) include a YAG laser (the lasing wavelength of 1064 nm), a femtosecond laser (the lasing wavelength of 780 nm), and a picosecond laser (the lasing wavelength of 1040 nm). The laser beam emitted by the irradiating unit 210 passes through a silicon-based resin and thus the phosphor 130 is directly irradiated with the laser beam 230. In other words, the irradiating unit 210 can process the phosphor 130, without causing thermal damage to the light transmissive resin included in the color converting portion 120. Among others, usage of a short pulse laser (an ultra-short pulse laser), such as a femtosecond laser and a picosecond laser, as the irradiating unit 210 (the laser oscillator 210a), allows the phosphor 130 to be processed, causing less thermal effects on the light transmissive resin included in the color converting portion 120.

The optical system 210b is a combination of a condenser lens which collects the laser beam and a scanning optical system, such as a polygon mirror. The optical system 210b is disposed facing the stage 240 on which the light emitting apparatus 100 is disposed, as shown in FIG. 3.

Figure 4:
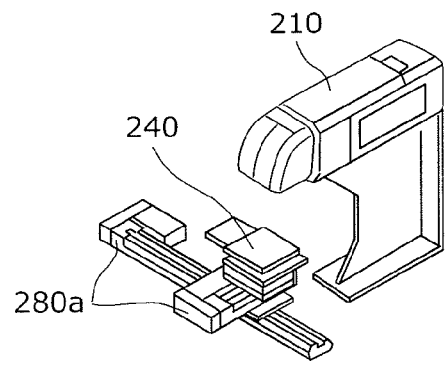
FIG. 4 is an external view of an irradiating unit.

FIG. 4 is an external view of the irradiating unit 210. As shown in FIG. 4, the irradiating unit 210 irradiates the light emitting apparatus 100 placed on the stage 240 with the laser beam 230. The light emitting apparatus 100 as being mounted on the substrate 10 may be placed on the stage 240, or solely the light emitting apparatus 100 may be placed on the stage 240.

The irradiating unit 210 causes the optical system 210b to determine a focus position of the laser beam 230 in the color converting portion 120, and irradiates with the laser beam 230 only the phosphor 130 that is near the focus position, thereby processing the phosphor 130. Very high energy is introduced (concentrated) into the focus position of the laser beam 230. This increases a temperature and a pressure at the focus position to several thousand Kelvin or higher and to about 1 GPa, respectively, for example. As a result, the irradiating unit 210 processes the phosphor 130 present near the focus position of the laser beam 230.

The control unit 250 controls a time at which the laser oscillator 210a emits the laser beam, an intensity (energy) and a wavelength of the laser beam emitted by the laser oscillator 210a, and so on.

The adjusting unit 280 adjusts relative positional relationship between the laser oscillator 210a, the optical system 210b, and the light emitting apparatus 100, thereby adjusting the relative positional relationship between the light emitting apparatus 100 and the laser beam 230.

In the embodiment 1, the adjusting unit 280 causes the first mechanism 280a to drive the optical system 210b and the stage 240 while fixing the position of the laser oscillator 210a, thereby adjusting the relative positional relationship between the light emitting apparatus 100 and an irradiation position of the laser beam 230.

The first mechanism 280a changes the focus position of the laser beam 230 relative to the light emitting apparatus 100 in an optical axis direction (Z axis direction in FIG. 3) of the laser beam 230 and in a direction perpendicular to the optical axis direction (X axis direction or Y axis direction in FIG. 3).

The first mechanism 280a, specifically, moves the condenser lens of the optical system 210b in Z axis direction to change the focus position of the laser beam 230 in Z axis direction. The first mechanism 280a also moves the stage 240 in parallel with X axis direction or Y axis direction to change the focus position of the laser beam 230 in X axis direction or Y axis direction.

This allows the irradiating unit 210 to focus the laser beam 230 to the phosphor 130 in the color converting portion 120.

In the embodiment 1, the adjusting unit 280 further includes the second mechanism 280b for changing an optical axis tilt of the laser beam 230 relative to the light emitting apparatus 100.

The second mechanism 280b drives a scanning optical system included in the optical system 210b to scan the laser beam, thereby changing the optical axis tilt of the laser beam 230 relative to the light emitting apparatus 100. In other words, since the second mechanism 280b allows adjusting the angle of incidence of the laser beam 230 to the surface of the light emitting apparatus 100, the irradiating unit 210 is allowed to irradiate the phosphor 130 obliquely with the laser beam 230.

Thus, when cutting a portion of the phosphor 130 by the laser beam 230 as described below, the slope of its cutting edge (a cutting surface) can be changed, thereby allowing processing of the phosphor 130 into a polyhedral shape.

The fabricating apparatus 200 employs the adjusting unit 280 (the first mechanism 280a and the second mechanism 280b) as a mechanism which allows accurate driving of the optical system 210b and the stage 240 on super fine resolution to adjust the relative positional relationship between the light emitting apparatus 100 and the irradiation position of the laser beam 230 on the order of micrometer.

The adjusting unit 280 may adjust the relative positional relationship between the light emitting apparatus 100 and the irradiation position of the laser beam 230, e.g., may be configured to move the laser oscillator 210a.

The first camera 221 captures an image of the light emitting apparatus 100. The state measuring unit 225 obtains and performs image processing on the image to measure a state of the phosphor 130 (e.g., a location of the phosphor 130). The state measuring unit 225 measures the state of the phosphor 130 in the color converting portion 120, specifically, by performing image processing, such as binalization, edge extraction, etc. on the image of the color converting portion 120 of the light emitting apparatus 100 captured by the first camera 221.

Here, the "state of the phosphor 130" includes at least the location of the phosphor 130 in the color converting portion 120, and a particle size and a shape of the phosphor 130.

For measuring the state of the phosphor 130, the first camera 221 changes its focus position and captures a plurality of images of the light emitting apparatus 100 which have different focus positions in Z axis direction. The state measuring unit 225 can measure a three-dimensional position of the phosphor 130, including not only X axis direction and Y axis direction but also Z axis direction, based on a focus position of a focused image, among the plurality of images having the different focus positions in Z axis direction.

The display apparatus 260 and the input apparatus 270 are user interfaces provided on the fabricating apparatus 200. The display apparatus 260 displays images captured by the first camera 221 and the second camera 222, a measurement by the state measuring unit 225, and a measurement by the chromaticity measuring unit 220. The input apparatus 270 receives various inputs from a user.

The display apparatus 260 and the input apparatus 270 allow the control unit 250 of the fabricating apparatus 200 to provide control to display the image captured by the first camera 221 on the display apparatus 260 and determine the phosphor 130 to be processed according to input made to the input apparatus 270.

In such a manner, according to the fabricating apparatus 200, the user is allowed to select an arbitrary phosphor particle 130 as a target to be processed, while visually checking an image of the color converting portion 120 displayed on the display apparatus 260.

The second camera 222, which is a color camera for capturing an image of the light emitting apparatus 100, captures a color image of the light emitting apparatus 100 as emitting light, and the chromaticity measuring unit 220 obtains and performs the image processing on the color image to measure a color of light on the surface of the color converting portion 120.

At this time, the chromaticity measuring unit 220 measures a color of light for each pixel of the obtained image such that a local irregular color in the color converting portion 120 can be reflected, rather than obtaining a color of light on the surface of the color converting portion 120 in a unified manner.

While the "color of light" in the embodiment 1 includes the chromaticity of irradiated light, hue (lightness and saturation), and a color temperature, it should be noted that in the embodiment 1, as one example, the chromaticity measuring unit 220 measures the chromaticity of light emitted by the light emitting apparatus 100.

It should be noted that the chromaticity measuring unit 220 may determine a representative value (an average value or a mean value) for each set of a plurality of pixels, and measure a color of light for each set.

Moreover, the chromaticity measuring unit 220 may be a measuring instrument which includes a general-purpose spectroscope for measuring optical properties such as the chromaticity, luminance, etc.

In this case, the chromaticity measuring unit 220, for example, measures spectrum of the light on a light emitting surface (a surface on the light-exiting side) of the light emitting apparatus 100 to obtain chromaticity. The chromaticity is displayed in image as shown in FIG. 5 on the display apparatus 260 included in the fabricating apparatus 200.

Figure 5:
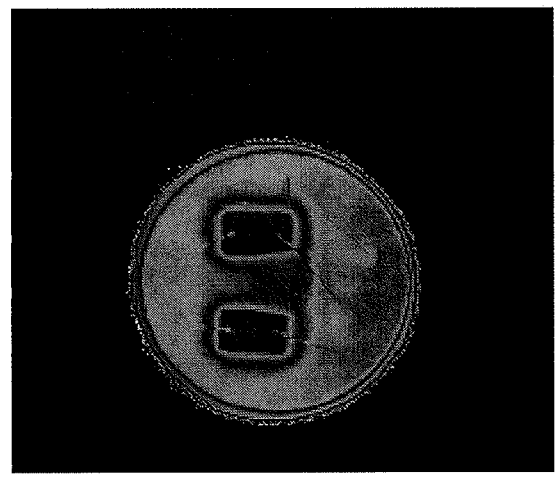
FIG. 5 shows an example of an image representing the chromaticity of the light emitting apparatus.

Illustrated in FIG. 5 is the image obtained by measuring the chromaticity of the light emitting surface (top surface) of the light emitting apparatus 100 as emitting light. In the image, the rounded region represents a light-emitting portion of the light emitting apparatus 100, and shades and tints in the rounded region represent chromaticity (the chromaticity distribution). Two squared regions in the rounded region of the image illustrated in FIG. 5 are where the LED chips 110 are located. It should be noted that in addition to the chromaticity (spectrum of the light emitted by the light emitting apparatus 100), the chromaticity measuring unit 220 may measure a strength of emission, light distribution property, etc.

Figure 6:
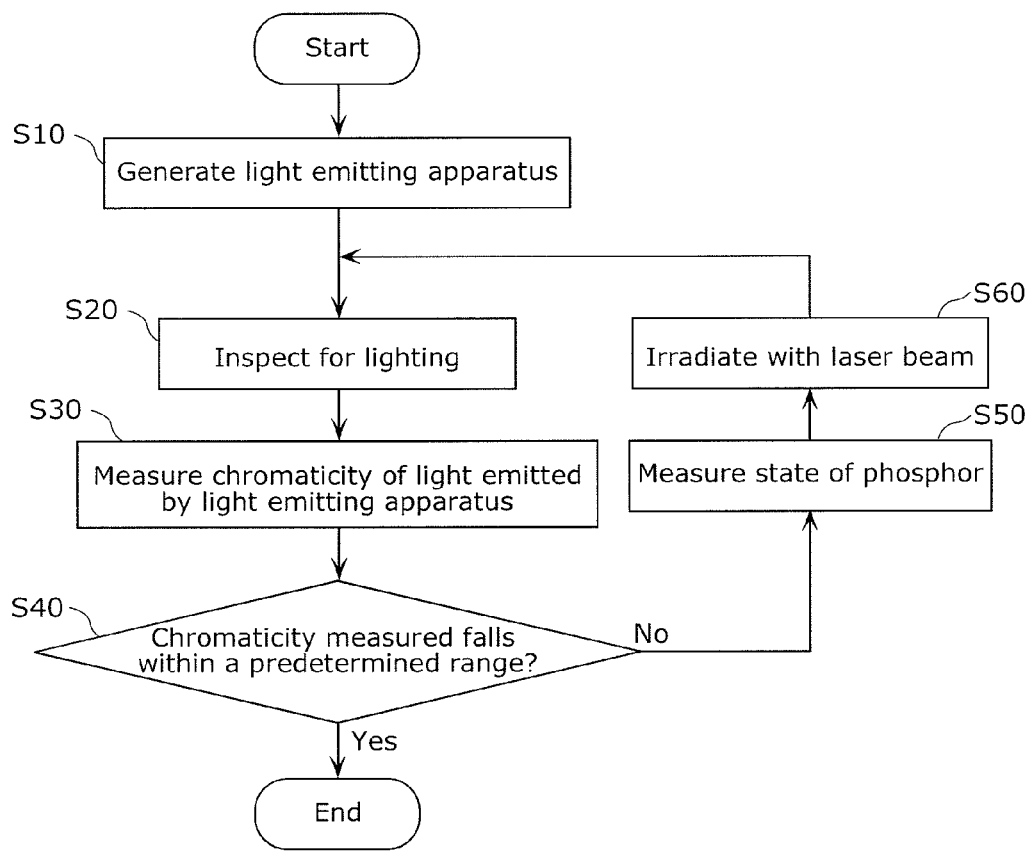
FIG. 6 is a flowchart illustrating a method for adjusting the chromaticity of the light emitting apparatus.

Next, a method for fabricating the light emitting apparatus 100 by the fabricating apparatus 200 (a method of adjusting the chromaticity) is described. FIG. 6 is a flowchart illustrating the method of adjusting the chromaticity of the light emitting apparatus 100.

First, the light emitting apparatus 100 is generated (S10). In the following, the method of generating the light emitting apparatus is described.

First, the LED chip 110 is mounted onto the recess of the package 140 having the lead frame 150 formed thereon. At this time, the LED chip 110 is electrically connected to the lead frame 150 by the bonding wire 160.

Next, the recess of the package 140 is filled with the color converting portion 120 in liquid form, containing the phosphor 130, the color converting portion 120 is cured, and the light emitting apparatus 100 is generated. More specifically, after mounting of the LED chip 110 onto the recess of the package 140, the color converting portion 120 in liquid form, containing the phosphor 130, is added dropwise (potting) in the recess of the package 140 and adhered to the package 140. It should be noted that the way of adhering the color converting portion 120 in liquid form to the package 140 is not limited to potting. The color converting portion 120 in liquid form may be adhered to the package 140 in any way, such as application or print (inkjet).

When adjusting the chromaticity of an already generated (off-the-shelf) light emitting apparatus 100, step S10 is omitted.

The generated light emitting apparatus 100 as being energized and emitting light is inspected for lighting (S20). Next, the chromaticity measuring unit 220 measures the chromaticity of light emitted by the light emitting apparatus 100 (S30). If the chromaticity measured by the chromaticity measuring unit 220 falls within a predetermined range (Yes in S40), the chromaticity adjustment of the light emitting apparatus 100 ends. The predetermined range is, for example, a specification for inspecting the chromaticity of the light emitting apparatus 100 in the fabrication process, or the like.

If the chromaticity measured by the chromaticity measuring unit 220 is outside the predetermined range (No in S40), the state measuring unit 225 measures the state of the phosphor 130 (550). Since the chromaticity measuring unit 220, as described above, measures the color of light for each pixel in the image obtained from the second camera 222, the chromaticity is determined to be outside the predetermined range even when the chromaticity of a portion of the surface of the color converting portion 120 is off the predetermined range.

Next, the irradiating unit 210 irradiates the light emitting apparatus 100 with the laser beam 230 (S60). At this time, irradiation conditions (such as radiation range and intensity) of the laser beam 230 are determined based on the chromaticity measured by the chromaticity measuring unit 220 and the state of the phosphor 130 measured by the state measuring unit 225.

It should be noted that a plurality of irradiation conditions of the laser beam 230 are pre-registered in association with measurements by the chromaticity measuring unit 220 and measurements by the state measuring unit 225, and irradiation conditions are automatically determined from among the registered irradiation conditions.

Then, after the light emitting apparatus 100 is inspected for lighting (S20), the chromaticity measuring unit 220 measures chromaticity of the light emitting apparatus 100 having been subjected to the irradiation with the laser beam 230 (S30). At a subsequent time, the irradiation with the laser beam 230 by the irradiating unit 210 and the measurement of the chromaticity by the chromaticity measuring unit 220 are repeated until the chromaticity measured by the chromaticity measuring unit 220 falls within the predetermined range. The operations in steps S20 through S60 may be automatically performed by the control unit 250 or may be semi-automatically performed by the user.

It should be noted that the measurement of the chromaticity by the chromaticity measuring unit 220 and the irradiation with the laser beam 230 by the irradiating unit 210 may be conducted in real time (concurrently). Specifically, the irradiating unit 210 may emit the laser beam 230 to directly process the phosphor 130 such that the chromaticity of light emitted by the light emitting apparatus 100 falls within the predetermined range (a predetermined value), while the chromaticity measuring unit 220 measuring the chromaticity of light emitted by the light emitting apparatus 100.

For example, while measuring the spectral distribution of the light on the light emitting surface (color variation in light emitting surface) of the light emitting apparatus 100, the irradiating unit 210 may irradiate the light emitting apparatus 100 with the laser beam 230 in response to the measured spectral distribution, thereby directly processing the phosphor 130 such that uniform spectral distribution or desired spectral distribution is obtained.

Alternatively, for example, the irradiating unit 210 may directly process the phosphor 130 by irradiating it with the laser beam 230, while the chromaticity measuring unit 220 measuring at least one of the chromaticity (the spectrum of the light emitted by the light emitting apparatus 100), the strength of emission, and the light distribution property.

In this case, the first camera 221 and the second camera 222 are disposed near the optical system 210b so as to capture images of the light emitting apparatus 100 even during the irradiation of the light emitting apparatus 100 with the laser beam 230.

In such a manner, the chromaticity measuring unit 220 measures the chromaticity and the irradiating unit 210 irradiates the light emitting apparatus 100 with the laser beam 230 in real time, thereby reducing a time taken to process the light emitting apparatus 100.

Figure 7:
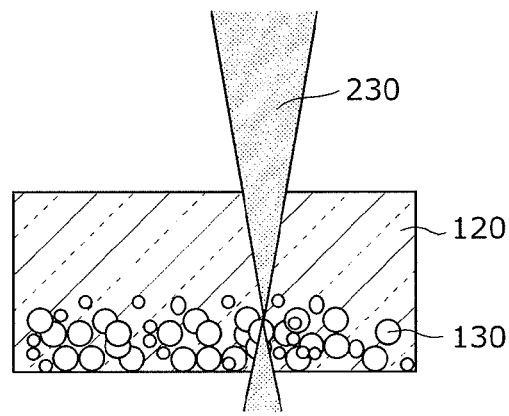
FIG. 7 is a schematic view for illustrating laser beam emission by the irradiating unit.

The irradiation with the laser beam 230 by the irradiating unit 210 is a feature of the chromaticity adjustment described above. FIG. 7 is a schematic view for illustrating the irradiation with the laser beam 230 by the irradiating unit 210.

As shown in FIG. 7, the irradiating unit 210 directly processes the phosphor 130, focusing the laser beam 230 to the phosphor 130. Specifically, in this case, the state measuring unit 225 measures at least the position of the phosphor 130, and the adjusting unit 280 adjusts the irradiation position of the laser beam 230 such that the irradiating unit 210 can irradiate the phosphor 130 to be processed with the laser beam. Then, the irradiating unit 210 irradiates the phosphor 130 to be processed which the laser beam 230 focusing its energy on the phosphor 130.

As described above, since the laser beam 230 passes through the light transmissive resin included in the color converting portion 120, damage to the light transmissive resin caused by the laser beam 230 is small. Because of this, according to the fabricating apparatus 200 (the irradiating unit 210), the chromaticity of light to be emitted by the light emitting apparatus 100 is adjusted while reducing carbonization and alternation of the light transmissive resin included in the color converting portion 120.

Figure 8:
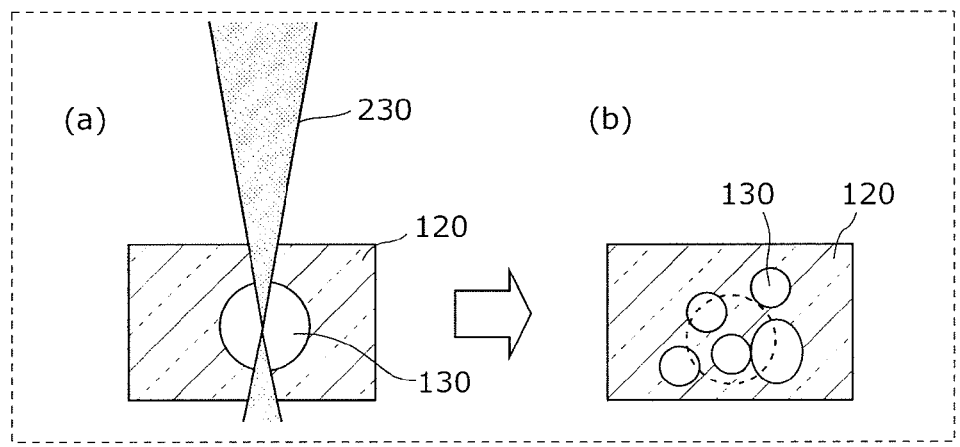
FIG. 8 is a first schematic view for illustrating a processing aspect of phosphor.
Figure 9:
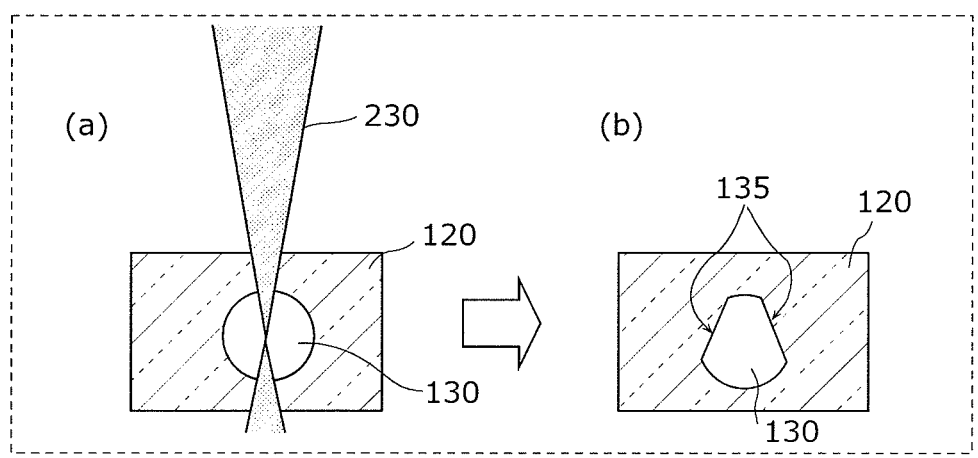
FIG. 9 is a second schematic view for illustrating a processing aspect of phosphor.

In the following, specific processing aspects of the phosphor 130 are described. FIGS. 8 and 9 are schematic views each for illustrating a processing aspect of the phosphor 130.

For example, as shown in (a) of FIG. 8, the irradiating unit 210 emits the laser beam 230, focusing on one phosphor particle 130, and crushes it into small particles as shown in (b) of FIG. 8.

Alternatively, for example, as shown in (a) of FIG. 9, the irradiating unit 210 may emit the laser beam 230, focusing on one phosphor particle 130, thereby crushing (chipping) it as shown in (b) of FIG. 9, to form a flat surface 135 on the phosphor particle 130. At this time, the phosphor 130 may be formed into a polyhedral shape by the irradiation with the laser beam 230.

As a result of the processing as described above, the particle size (the shape) of the phosphor 130 is changed, causing alternation of the path of light to be emitted by the LED chip 110 and change in surface area of the phosphor 130. This shifts the chromaticity of light to be emitted by the light emitting apparatus 100 toward yellow. In other words, the processing of the phosphor 130 allows the chromaticity of light to be emitted by the light emitting apparatus 100 to be adjusted.

It should be noted that each processing aspect of the phosphor 130 as described above can be achieved by adjusting at least one of a irradiation time, a location of irradiation (the focus position), and the irradiation energy of the laser beam 230.

Figure 10:
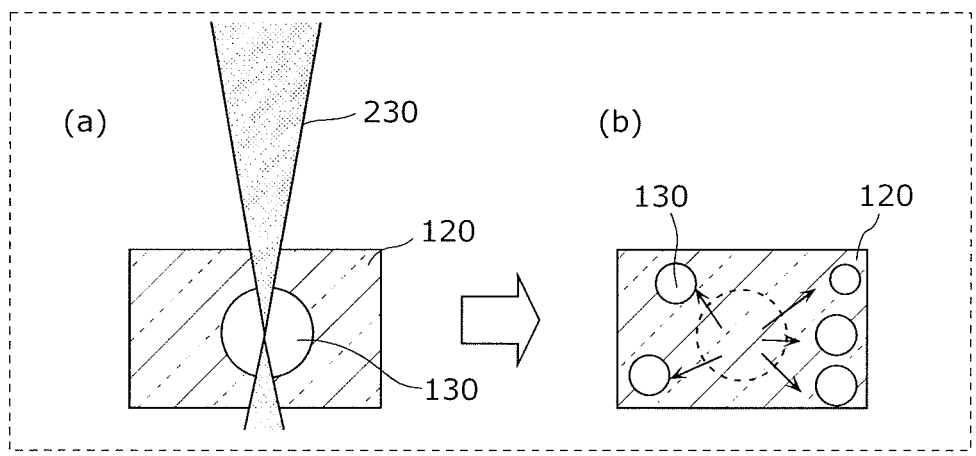
FIG. 10 is a schematic view for illustrating a processing aspect of crushing and scattering the phosphor by irradiating the phosphor with the laser beam.

Alternatively, the chromaticity of light to be emitted by the light emitting apparatus 100 may be adjusted by the irradiation with the laser beam 230 crushing and scattering the phosphor 130. FIG. 10 is a schematic view for illustrating a processing aspect in which the phosphor 130 is crushed and scattered by the irradiation with the laser beam 230.

As shown in (a) of FIG. 10, the irradiating unit 210 focuses on and irradiates one phosphor particle 130 with, for example, the laser beam 230 having the irradiation energy set simply higher than that for crushing the phosphor particle 130. This can crush the phosphor 130 into small particles and scatter them as shown in (b) of FIG. 10. The small particles obtained by crushing the phosphor 130 are scattered, cutting through the light transmissive resin.

Scattering the phosphor 130 as such alters the path of light to be emitted by the LED chip 110, which changes the chromaticity of light to be emitted by the light emitting apparatus 100. In other words, the chromaticity of light to be emitted by the light emitting apparatus 100 is can be adjusted.

It should be noted that the irradiating unit 210 may selectively irradiate some of the plurality of phosphor particles 130 included in the color converting portion 120 with the laser beam 230 to adjust the chromaticity of light to be emitted by the light emitting apparatus 100. In the following, an example in which some of the plurality of phosphor particles 130 included in the color converting portion 120 are selectively irradiated with the laser beam 230 will be described with reference to FIGS. 11 and 12.

Figure 11:
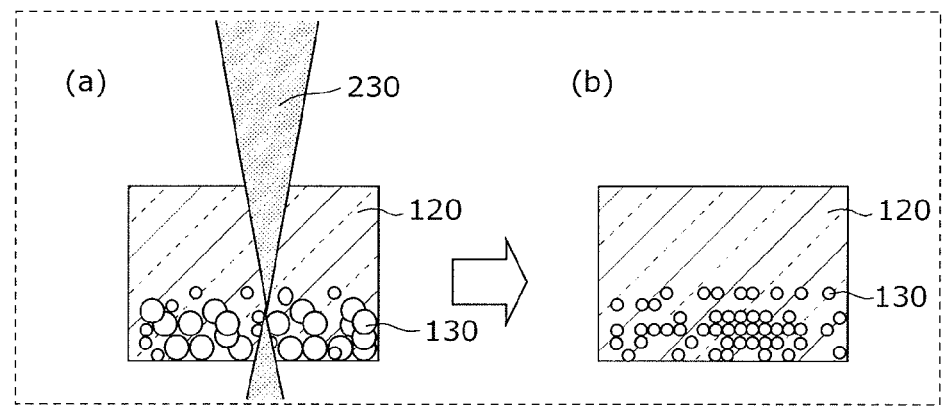
FIG. 11 is a schematic view for illustrating an example where the phosphor particles that have particle sizes greater than a predetermined value are selectively irradiated with the laser beam.
Figure 12:
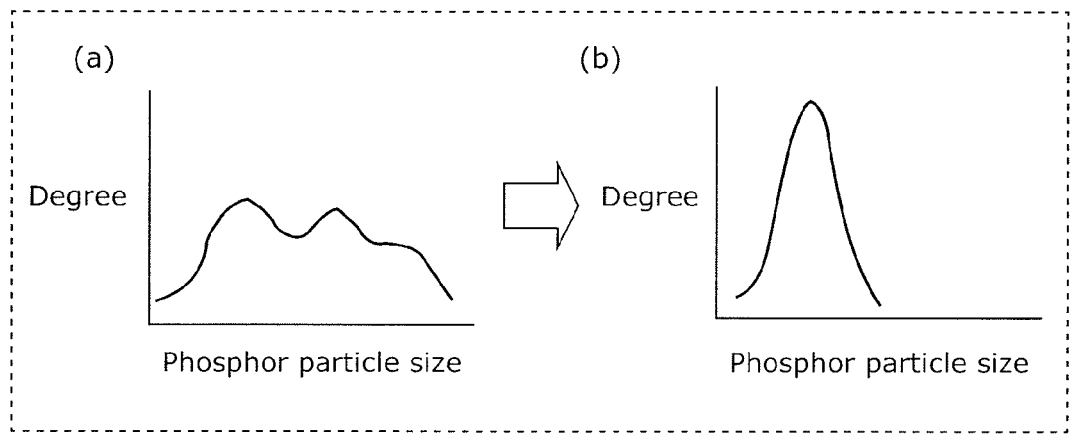
FIG. 12 is a schematic view depicting a particle size distribution of the phosphor particles that have particle sizes greater than the predetermined value which are selectively irradiated with the laser beam.

FIG. 11 is a schematic view for illustrating the example where the laser beam 230 is selectively emitted to the phosphor particles 130 which have particle sizes greater than a predetermined value. FIG. 12 is a schematic view depicting a particle size distribution when the laser beam 230 is selectively emitted to the phosphor particles 130 having the particle sizes greater than the predetermined value.

Prior to the irradiation with the laser beam 230, the phosphor particles 130 in the color converting portion 120 exhibit variation in particle size ((a) of FIG. 11 and (a) of FIG. 12). In such a case, the irradiating unit 210 selectively irradiates, with the laser beam 230, the phosphor 130 that has a particle size greater than a predetermined particle size, among the plurality of phosphor particles 130, to crush it into small particles ((b) of FIG. 11). This reduces the variations in particle size among the plurality of phosphor particles 130 ((b) of FIG. 12). In this case, the state measuring unit 225 measures at least the particle size of the phosphor 130.

Changing the particle size distribution of the phosphor 130 in such a manner alters the path of light to be emitted by the LED chip 110, thereby changing the chromaticity of light to be emitted by the light emitting apparatus 100. In other words, the chromaticity of light to be emitted by the light emitting apparatus 100 can be adjusted.

Whether the phosphor 130 has the predetermined particle size or greater is determined by image processing (an image recognition process), using the first camera 221, carried out by the state measuring unit 225.

For example, if the particle size distribution is predetermined as an indication for adjusting the chromaticity, the irradiating unit 210 may crush the plurality of phosphor particles into small particles by irradiating them with the laser beam 230 such that the phosphor particles 130 fall within the predetermined particle size distribution. In this case also, whether the predetermined particle size distribution is achieved is determined by the image processing (the image recognition process), using the first camera 221, carried out by the state measuring unit 225, as described above.

It should be noted that the fabricating apparatus 200 may be configured to selectively practice the plurality of processing aspects described above. Specifically, the fabricating apparatus 200 may include several types of the optical systems 210b suitable for the respective processing aspects, and the control unit 250 may switch and select a suitable optical system 210b from among the optical systems 210b for each processing aspect.

The method (the chromaticity adjusting method) and the apparatus for fabricating the light emitting apparatus 100 according to the embodiment 1 have been described. In the above fabricating method and fabricating apparatus, the phosphor 130 is directly processed by being irradiated with the laser beam 230 which passes through the light transmissive resin included in the color converting portion 120. This allows the chromaticity of light to be emitted by the light emitting apparatus 100 to be adjusted while reducing carbonization and alternation of the light transmissive resin included in the color converting portion 120.

Moreover, according to the above fabricating method and fabricating apparatus, for example, partial irregular color within the color converting portion 120 due to the phosphor 130 in a specific area can be eliminated by processing only the phosphor 130 in the specific area.

Further, according to the above fabricating method, the phosphor 130 to be process is selected from among the plurality of phosphor particles 130 included in the color converting portion 120, allowing fine-grained adjustment of chromaticity, as compared to merely changing the laser irradiation dose. In other words, the chromaticity (the color of light) of the light emitting apparatus 100 can be adjusted more accurately and efficiently than conventional.

It should be noted that the irradiation with the laser beam 230 does not deactivate the phosphor 130 in the above fabricating method and fabricating apparatus. The deactivation of the phosphor 130 as used herein refers to a state of the phosphor 130 in which the phosphor 130, even though the appearance visually seen remains the same, does not emit phosphor light in response to irradiation with excitation light having a predetermined wavelength.

(Other Embodiment)

While the method and the apparatus for fabricating the light emitting apparatus according to the embodiment 1 have been described, the present invention is not limited to the embodiment described above.

While in the embodiment, the description is set forth that the phosphor 130 is yellow phosphor, besides yellow phosphor, the color converting portion 120 may contain, green phosphor which emits green phosphor light or red phosphor which emits red phosphor light, for example. It should be noted that the green phosphor or the red phosphor is mixed with the color converting portion 120 for the purposes of enhancing color rendering of white light. Alternatively, the color converting portion 120 may contain green phosphor and red phosphor in place of yellow phosphor and the light emitting apparatus may emit white light by a combination of green phosphor light and red phosphor light emitted by the green phosphor and the red phosphor, respectively, and blue light emitted by the LED chip 110.

The LED chip 110 may be an LED chip which emits light other than blue light. For example, the LED chip 110 may be an LED chip which emits near ultraviolet. In this case, the color converting portion 120 contains phosphor particles which individually emit the primary colors (red, green, blue).

Figure 13:
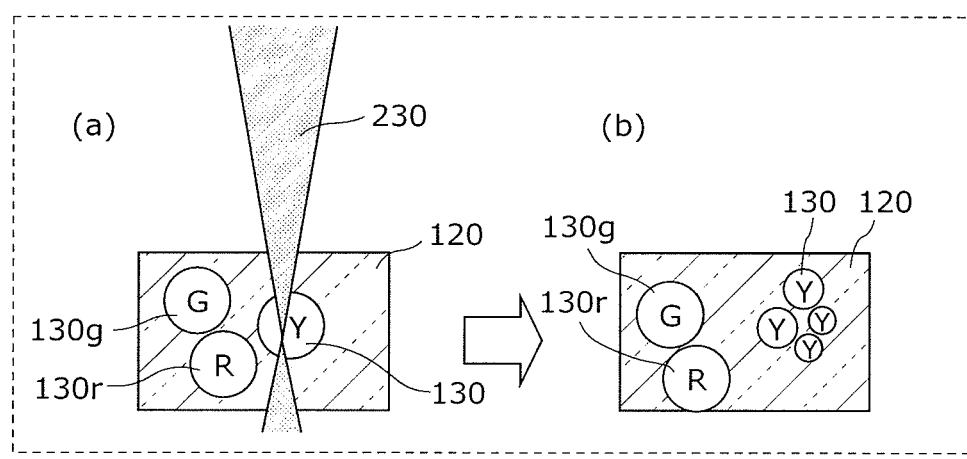
FIG. 13 is a diagram for illustrating a method for adjusting the chromaticity of the light emitting apparatus, using several types of phosphor particles having different emission colors.

As described above, if the color converting portion 120 contains several types of phosphor particles which have significantly different emission colors (substantially different emission spectra), the irradiating unit 210 may directly process a phosphor particle having a specific emission color, among the several types of phosphor particles having the different emission colors, by irradiating it with the laser beam 230. FIG. 13 is a diagram for illustrating a method of adjusting the chromaticity of the light emitting apparatus, using several types of phosphor particles having different emission colors.

The color converting portion 120 included in the light emitting apparatus shown in (a) of FIG. 13 contains three types of phosphor particles which are red phosphor 130r, green phosphor 130g, and the phosphor 130 which is yellow phosphor.

In such a case, the irradiating unit 210, for example, selectively irradiates the phosphor 130, among the three types of phosphor particles, with the laser beam 230 to crush it into small particles, as shown in (b) of FIG. 13. The selection of a type of phosphor is made by, for example, image processing (an image recognition process), using the first camera 221 (in this case, a color camera), carried out by a state measuring unit 225, based on a color, appearance, a shape, etc. of the phosphor of each emission color.

Direct processing of phosphor of a specific emission color, among the several types of phosphor particles having different emission colors, by irradiating it with the laser beam 230 as such shifts chromaticity of light to be emitted by the light emitting apparatus in a desired direction, thereby more accurately adjusting the chromaticity.

It should be noted that a light wavelength converting material other than phosphor may be used in the light emitting apparatus 100, an example of which is a wavelength converting material, such as a semiconductor, a metal complex, organic dyes, pigments, etc., which absorbs light having a certain wavelength and is formed of a material which emits light having a different wavelength than the absorbed light. In other words, the fabricating method and fabricating apparatus according to the present invention are also applicable to light emitting apparatuses in which light wavelength converting materials other than phosphor are used.

Figure 14:
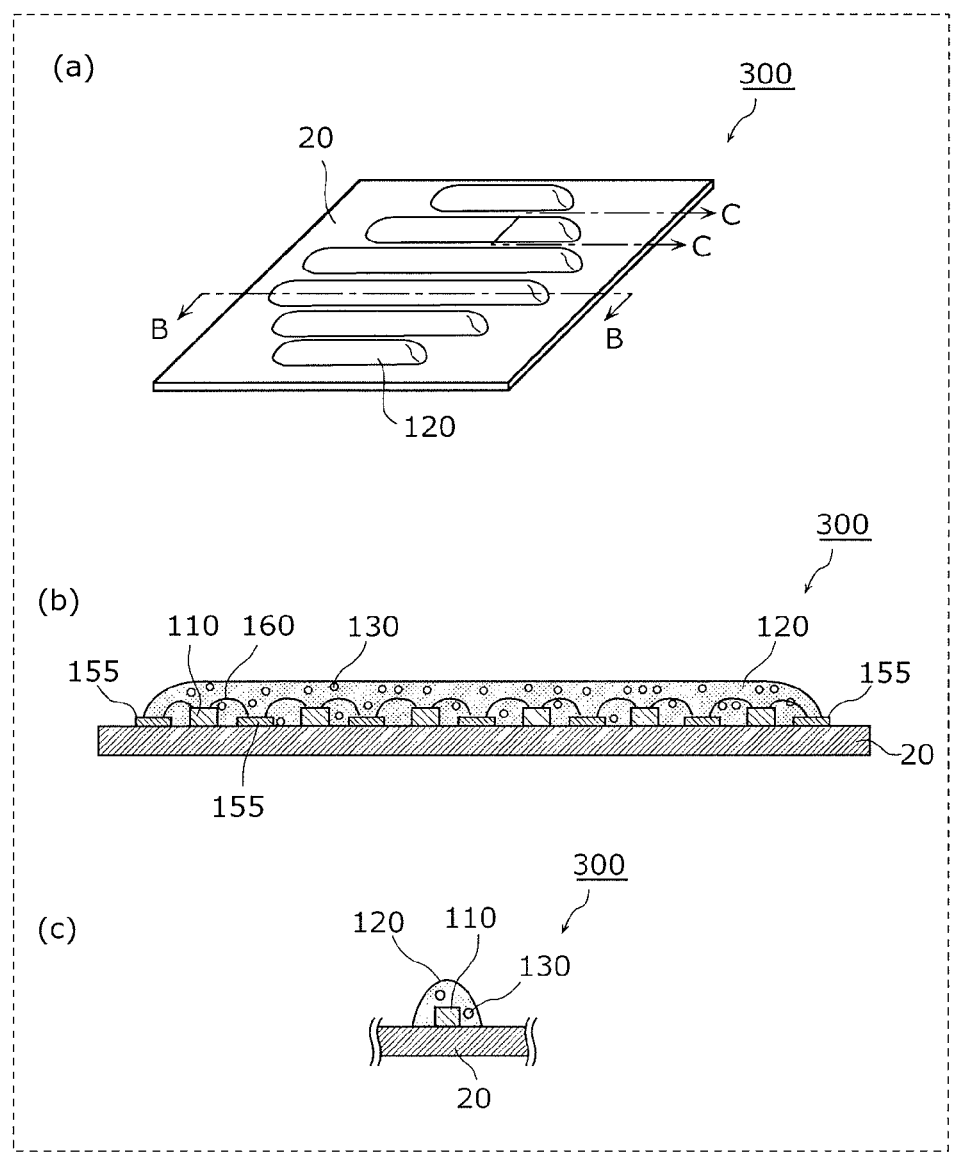
FIG. 14 is a diagram for illustrating a COB light emitting apparatus.

Moreover, while the description is set forth in the above embodiment, with reference to the case where the light emitting apparatus 100 is an SMD light emitting apparatus, the fabricating method and fabricating apparatus according to the present invention are also applicable to a COB (chip on board) light emitting apparatus. FIG. 14 is a diagram for illustrating a COB light emitting apparatus. Part (a) of FIG. 14 is a plan view (a top view) showing configuration of the COB light emitting apparatus. Part (b) of FIG. 14 is a cross-sectional view of the light emitting apparatus in (a) of FIG. 14, taken along B-B. Part (c) of FIG. 14 is a cross-sectional view of the light emitting apparatus in (a) of FIG. 14, taken along C-C.

A COB light emitting apparatus 300 includes a substrate 20, a plurality of LED chips 110, and the color converting portion 120 which contains the phosphor 130 and seals the plurality of LED chips 110 altogether. The light emitting apparatus 300 also includes a line 155 and a bonding wire 160.

The LED chips 110 are mounted in lines directly on the substrate 20. The example of FIG. 14 shows six lines of the LED chips 110. On the top surface of each of the LED chips 110 in each line, a p-side electrode and an n-side electrode for supply a current are formed. The p-side electrode and the n-side electrode are wire bonded to the line 155 by the bonding wire 160.

The color converting portion 120 has a substantially semi-ellipsoid shape concave up in cross-sectional profile. The color converting portion 120 is formed in a straight line shape along the alignment direction of the LED chips 110, covering all the lines of the LED chips 110 on the substrate 20. The color converting portion 120 and the phosphor 130 each comprise the same material as described in the embodiment above.

The method and apparatus for fabricating the light emitting apparatus according to the present invention are applicable also to the COB light emitting apparatus 300 as described above.

Moreover, while in the embodiment, the light emitting element is described, with reference to the LED chip 110, the light emitting element may be a semiconductor light-emitting element, such as a semiconductor laser, or any other type of solid state light-emitting device, such as an organic electro luminescence (EL) or an inorganic EL, for example.

It should be noted that each component (the control unit 250, the chromaticity measuring unit 220, and the state measuring unit 225) in each embodiment may be configured with dedicated hardware or may be implemented by executing a software program suitable for the component. The component may be implemented by a program execution unit, such as a CPU or processor, loading and executing the software program stored in a recording medium such as a hard disk or a semiconductor memory.

The present invention may be implemented in a form of the light emitting apparatus described in the above embodiment.

While the method and apparatus for fabricating the light emitting apparatus according to one or more aspects of the present invention have been described, the present invention is not limited to the embodiments. Various modifications to the present embodiments that may be conceived by those skilled in the art or combinations of the components of different embodiments are intended to be included within the scope of the one or more aspects of the present invention, without departing from the spirit of the present invention.

REFERENCE SIGNS LIST 10, 20 substrate
100, 300 light emitting apparatus
110 LED chip (light emitting element)
120 color converting portion (light transmissive resin)
120a phosphor layer
120b resin layer
130 phosphor
130g green phosphor
130r red phosphor
135 surface
140 package
150 lead frame
155 line
160 bonding wire
200 fabricating apparatus
210 irradiating unit
210a laser oscillator
210b optical system
220 chromaticity measuring unit
221 first camera
222 second camera
225 state measuring unit (measuring unit)
230 laser beam
240 stage
250 control unit
260 display apparatus
270 input apparatus
280 adjusting unit
280a first mechanism
280b second mechanism

The invention claimed is:

1. A method for fabricating a light emitting apparatus in which at least a portion of a light emitting element is covered with a light transmissive resin containing phosphor particles which are pre-made and emit light when excited by light emitted by the light emitting element, the method comprising:

(a) processing shapes of the phosphor particles by irradiating the phosphor particles with a laser beam which passes through the light transmissive resin, to adjust chromaticity of light to be emitted by the light emitting apparatus, wherein in the processing, the shapes of the phosphor particles are processed by the phosphor particles being irradiated with the laser beam to adjust the chromaticity of light to be emitted by the light emitting apparatus to a predetermined value, while measuring chromaticity of the light emitted by the light emitting apparatus, and wherein in the processing, the laser beam is focused on the phosphor particles.

2. The method according to claim 1, wherein
in the processing, the phosphor particles are crushed into small particles by being irradiated with the laser beam.

3. The method according to claim 1, wherein
in the processing, the phosphor particles each form a flat surface by being irradiated with the laser beam.

4. The method according to claim 1, wherein
in the processing, the phosphor particles are crushed and scattered by being irradiated with the laser beam.

5. The method according to claim 2, wherein
in the processing, a phosphor particle that has a predetermined particle size or greater, among the phosphor particles, is crushed into small particles by being irradiated with the laser beam, to reduce variations in particle size.

6. The method according to claim 2, wherein
in the processing, the phosphor particles are crushed into small particles by being irradiated with the laser beam, into a predetermined particle size distribution.

7. The method according to claim 1, wherein
in the processing, a shape of a specific phosphor particle, among the phosphor particles, is processed by the specific phosphor particle being irradiated with the laser beam.

* * * * *